(12) United States Patent
Furusho et al.

(10) Patent No.: US 9,668,343 B2
(45) Date of Patent: May 30, 2017

(54) PHOTOCURABLE ELECTROCONDUCTIVE INK COMPOSITION

(71) Applicant: TANAKA KIKINZOKU KOGYO K.K., Tokyo (JP)

(72) Inventors: Rikia Furusho, Hiratsuka (JP); Yoshito Imai, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 141 days.

(21) Appl. No.: 14/354,736

(22) PCT Filed: Oct. 24, 2012

(86) PCT No.: PCT/JP2012/077399
§ 371 (c)(1),
(2) Date: Apr. 28, 2014

(87) PCT Pub. No.: WO2013/061980
PCT Pub. Date: May 2, 2013

(65) Prior Publication Data
US 2014/0311779 A1    Oct. 23, 2014

(30) Foreign Application Priority Data

Oct. 28, 2011  (JP) .................. 2011-237159

(51) Int. Cl.
| | |
|---|---|
| *C09D 11/52* | (2014.01) |
| *C09D 11/101* | (2014.01) |
| *C09D 11/037* | (2014.01) |
| *H01B 1/22* | (2006.01) |
| *H05K 1/09* | (2006.01) |

(52) U.S. Cl.
CPC ........... *H05K 1/097* (2013.01); *C09D 11/037* (2013.01); *C09D 11/101* (2013.01); *C09D 11/52* (2013.01); *H01B 1/22* (2013.01)

(58) Field of Classification Search
CPC ..... C09D 11/52; C09D 11/101; C09D 11/037; H01B 1/22; H01B 1/097
USPC ........ 522/80, 113, 96, 120, 121, 90
See application file for complete search history.

(56) References Cited

U.S. PATENT DOCUMENTS

| | | | |
|---|---|---|---|
| 7,404,852 B2 | 7/2008 | Ishibashi et al. | |
| 7,569,160 B2 | 8/2009 | Oldenzijl et al. | |
| 7,955,696 B2 * | 6/2011 | Baikerikar | C08L 33/10 428/328 |
| 8,071,888 B2 | 12/2011 | Shiraishi et al. | |
| 2007/0006773 A1 | 1/2007 | Ishibashi et al. | |
| 2007/0106017 A1 * | 5/2007 | Kessel | C09D 5/24 524/589 |
| 2008/0152926 A1 * | 6/2008 | Baikerikar | C08L 33/10 428/422.8 |
| 2008/0169122 A1 | 7/2008 | Shiraishi et al. | |
| 2008/0250972 A1 | 10/2008 | Oldenzijl | |

FOREIGN PATENT DOCUMENTS

| | | |
|---|---|---|
| EP | 1860163 A1 | 11/2007 |
| EP | 1980597 A1 | 10/2008 |
| JP | 2005-187726 A | 7/2005 |
| JP | 2005-248061 A | 9/2005 |
| JP | 2007-119682 A | 5/2007 |
| JP | 2008-260938 A | 10/2008 |
| JP | 2011-207960 A | 10/2011 |
| WO | 2006/134633 A1 | 12/2006 |

OTHER PUBLICATIONS

International Search Report dated Nov. 20, 2012 issued in corresponding PCT/JP2012/077399 application (pp. 1-2).
English Translation Abstract of JP 2005-187726 A published Jul. 14, 2005.
English Translation Abstract of JP 2005-248061 A published Sep. 15, 2005.
English Translation Abstract of JP 2007-119682 A published May 17, 2007.
English Translation Abstract of JP 2008-260938 A published Oct. 30, 2008.
English Translation Abstract of JP 2011-207960 A published Oct. 20, 2011.
Supplementary European Search Report dated Sep. 21, 2015 issued in corresponding EP 12843350.5 application (pp. 1-4).

* cited by examiner

*Primary Examiner* — Sanza McClendon
(74) *Attorney, Agent, or Firm* — Millen, White, Zelano, Branigan, P.C.

(57) ABSTRACT

Disclosed is a photocurable electroconductive ink composition including: (A) an oligomer of urethane acrylates, (B) three types of acrylates composed of either tetrafunctional acrylates or trifunctional acrylates, difunctional acrylates and monofunctional acrylates, (C) an electroconductive filler, (D) two or more types of photopolymerization initiators and (E) a polymeric dispersing agent, wherein the amount of the electroconductive filler (C) to be mixed is from 77 to 85% by mass based on the total mass of the photocurable electroconductive ink composition, and 80% by mass or more of the electroconductive filler (C) is a scaly, foil-like or flakey silver powder having a particle size corresponding to a particle size distribution at 50% of more than 5 μm.

22 Claims, No Drawings

PHOTOCURABLE ELECTROCONDUCTIVE INK COMPOSITION

TECHNICAL FIELD

The present invention relates to a photocurable electroconductive ink composition, and more particularly to a photocurable electroconductive ink composition which enables satisfactory printing accuracy, high-speed printability and adhesion, and stable electroconductivity without needing a curing heat treatment when electronic circuits are formed on various base materials by flexographic printing, gravure printing or the like.

BACKGROUND ART

In recent years, intensive studies have been made toward the commercialization of a medication management monitoring system for monitoring a medication state at home. The outline of this system will be described below. First, an electronic circuit is printed on a package of medicines to be taken, for example, medical capsules, tablets and the like using an electroconductive ink (silver paste) to produce a package with an electronic circuit formed thereon. Thereafter, when the package is opened in case a recipient prescribed with medicine takes medicine, an electronic circuit is cut off. Opening of the package of medicine is detected by cutting off of the electronic circuit, and a signal is sent to a server of a medical institution through the internet. During system running, when the recipient forgets to take medicine, or erroneously takes medicine, the system gives the alarm to the recipient himself or herself and also gives the recipient notice by automatically sending e-mail from the server of the medical institution. Thus, an improvement in medicine noncompliance can be made.

In order to widely popularize the above-mentioned medication management monitoring system, there are many problems to solve. It is possible to exemplify, as one of problems, the production of a medicine package on which an electronic circuit is printed using an electroconductive ink. That is, there is a need to miniaturize an electronic circuit corresponding to the medicine package so as to put the above system into practical use. Therefore, there is a need to develop a non-heat curable electroconductive ink which enables satisfactory printing accuracy, printability and adhesion, and stable electroconductivity.

In recent years, attention has been focused on printing methods using an ultraviolet curable or electron beam curable ink in flexographic printing, offset printing, gravure printing and the like. These methods have the merit of being capable of reducing the drying time since a volatile organic compound is not generated, leading to enhanced productivity, and also capable of printing on a base material having low ink absorptivity, such as a plastic film.

There have been developed many electroconductive inks which can be employed in such high-speed printing method and also exhibit high electroconductivity after curing. For example, Patent Document 1 discloses, as an electroconductive ink suited for flexographic printing, rotogravure printing and the like, a composition comprising one or more oligomers of urethane acrylates, one or more acrylate carriers of diacrylate, triacrylate and the like, one or more reactive monomers of vinylethers, one or more electroconductive fillers of a flakey silver powder, and one or more photoinitiators.

Also, Patent Document 2 discloses, as an electroconductive ink suited for flexographic printing, screen printing and the like, an active energy curable electroconductive ink composition comprising an electroconductive powder, an active energy curable resin and a diluent as essential components, wherein the active energy curable resin is composed of a polyfunctional urethane acrylate.

Furthermore, Patent Document 3 discloses, as an electroconductive ink suited for flexographic printing, gravure printing, gravure offset printing and the like, an electroconductive ink comprising electroconductive fine particles (A) having an average particle size of 0.001 to 0.10 μm and an electroconductive powder (B) having an average particle size or average equivalent circle particle size of 0.5 to 10 μm, the electroconductive ink further including a flakey, scaly, tubular, spherical or foil-like electroconductive substance and a vinyl chloride/vinyl acetate/hydroxyalkyl (meth)acrylate copolymer resin.

CITATION LIST

Patent Literature

Patent Literature 1
Japanese Unexamined Patent Application Publication No. 2008-260938
Patent Literature 2
Japanese Unexamined Patent Application Publication No. 2007-119682
Patent Literature 3
International Publication No. WO 2006/095611

SUMMARY OF INVENTION

Technical Problem

A conventional electroconductive ink had a problem with printability and printing accuracy that an increase in the content of an electroconductive filler for realization of satisfactory electroconductivity is likely to cause transfer errors and rubbing during printing at particularly high speed, leading to non-electrification after transfer printing, followed by curing. There was also a problem with curability that the increase in the content of an electroconductive filler may prevent ultraviolet rays from reaching the whole electroconductive ink, leading to formation of a lower surface of the printed electroconductive ink in an uncured state. There was also a problem that existence of ozone (generated from oxygen under exposure to light having a wavelength of 220 nm or less) on a surface of a base material may cause curing inhibition during ultraviolet curing, thus making it difficult to sufficiently perform curing.

In light of these circumstances, an object of the present invention is to provide an ultraviolet curable electroconductive ink composition which has satisfactory printability, printing accuracy, adhesion to a base material and is suited for high-speed printing such as flexographic printing, and also can exhibit stable electroconductive properties, so as to enable high-definition printing without causing transfer errors and rubbing even in the case of high-speed printing.

Solution to Problem

In order to achieve the above object, the present inventors have intensively studied while particularly paying attention to a photopolymerization resin precursor and a photopolymerization initiator among components composing the electroconductive ink, thus completing the present invention.

That is, the present invention is directed to a photocurable electroconductive ink composition including:

(A) an oligomer of urethane acrylates, (B) three types of acrylates composed of either tetrafunctional acrylates or trifunctional acrylates, difunctional acrylates and monofunctional acrylates, (C) an electroconductive filler, (D) two or more types of photopolymerization initiators, and (E) a polymeric dispersing agent, wherein the amount of the electroconductive filler (C) to be mixed is from 77 to 85% by mass based on the total mass of the photocurable electroconductive ink composition, and 80% by mass or more of the electroconductive filler (C) is a scaly, foil-like or flakey silver powder having a particle size corresponding to a particle size distribution at 50% of more than 5 µm.

Advantageous Effects of Invention

The ultraviolet curable electroconductive ink composition of the present invention is suited for high-speed printing such as flexographic printing, and also can exhibit stable conductivity because of its satisfactory printability, printing accuracy and adhesion to various base materials such as a plastic sheet, and excellent high-speed printability.

DESCRIPTION OF EMBODIMENTS

As mentioned above, the photocurable electroconductive ink composition of the present invention is basically composed of (A) an oligomer of urethane acrylates, (B) acrylates, (C) an electroconductive filler, (D) a photopolymerization initiator, and (E) a polymeric dispersing agent. First, the respective components will be described in detail.

The component (A) is an oligomer of urethane acrylates and its basic structure is composed of a soft segment (polyol moiety) located at the center of a molecular chain, and a hard segment (acrylate moiety and isocyanate moiety) located at both ends. The oligomer (A) of urethane acrylates forms a crosslinked polymer network structure together with an acrylate monomer as the component (B), thus forming a flexible and tough film having excellent adhesion to a base material. According to the present invention, employment of a combination of the components (A) and (B) enables maintenance of low viscosity and prevention of a hindrance of the photopolymerization reaction regardless of a large amount of an electroconductive filler (C), thus making it possible to obtain satisfactory printability, printing accuracy and high-speed printability, and also stable electroconductivity.

The oligomer (A) of urethane acrylates is obtained by reacting an isocyanate compound, a polyhydric alcohol such as an ester-based polyol, and a hydroxyl group-containing acrylate. Herein, the oligomer refers to a polymer in which a monomer unit is repeated two to several tens of times. As used herein, the term "acrylate" means both acrylate and methacrylate. The number of acrylate functional groups contained in a molecule of the oligomer is preferably 3 or more (polyfunctional).

Examples of the oligomer (A) of urethane acrylates include ALLONIX M-1100, M-1200, M-1210, M-1310, M-1600 and M-1960 manufactured by Toagosei Co., Ltd.; R1204, R1211, R1213, R1217, R1218, R1301, R1302, R1303, R1304, R1306, R1308, R1901 and R1150 manufactured by Dai-Ichi Kogyo Seiyaku Co. Ltd.; EBECRYL 230, 270, 4858, 8402, 8804, 8807, 8803, 9260, 1290, 1290K, 5129, 4842, 8210, 210, 4827, 6700, 4450 and 220 manufactured by DAICEL-CYTEC COMPANY, LTD.; NK oligo U-4HA, U-6HA, U-15HA, U-108A and U200AX manufactured by Shin-Nakamura Chemical Co., Ltd. and the like.

The amount of the oligomer (A) of urethane acrylates to be mixed is preferably from 2 to 5% by mass, and more preferably from 3 to 4% by mass, based on the total mass of photocurable electroconductive ink composition of the present invention. The amount of less than 2% by mass may cause deterioration of adhesion to a substrate after printing, and deterioration of bending resistance. The amount of more than 5% by mass may cause an increase in viscosity, leading to deterioration of workability (printability).

The component (B) includes at least three types of acrylates selected from tetrafunctional acrylates, trifunctional acrylates, difunctional acrylates and monofunctional acrylates. It is particularly preferred that the photocurable electroconductive ink composition of the present invention includes, as essential components, either tetrafunctional acrylates or trifunctional acrylates, difunctional acrylates and monofunctional acrylates. That is, it is preferred to use a combination of tetrafunctional acrylates, difunctional acrylates and monofunctional acrylates, a combination of trifunctional acrylates, difunctional acrylates and monofunctional acrylates, or a combination of all tetrafunctional acrylates, trifunctional acrylates, difunctional acrylates and monofunctional acrylates. Optimally, a combination of either tetrafunctional acrylates or trifunctional acrylates, difunctional acrylates and monofunctional acrylates is used.

Examples of tetrafunctional acrylates include pentaerythritol tetraacrylate, ditrimethylolpropane tetraacrylate, ethoxylated pentaerythritol tetraacrylate, ethylene oxide-modified diglycerin tetraacrylate and the like. These tetrafunctional acrylates may be used alone, or two or more tetrafunctional acrylates may be used in combination.

Examples of trifunctional acrylates include trimethylolpropane triacrylate, glycerol triacrylate, ethylene oxide-modified trimethylolpropane triacrylate, pentaerythritol triacrylate, tris(2-hydroxyethyl)isocyanurate triacrylate, and propoxylated glyceryl triacrylate. These trifunctional acrylates may be used alone, or two or more trifunctional acrylates may be used in combination.

Examples of difunctional acrylates include ethylene glycol diacrylate, diethylene glycol diacrylate, triethylene glycol diacrylate, tetraethylene glycol diacrylate, polyethylene glycol (200) diacrylate, polyethylene glycol (400) diacrylate, polyethylene glycol (600) diacrylate, polyethylene glycol (1000) diacrylate, polypropylene glycol (400) diacrylate, polypropylene glycol (700) diacrylate, 1,3-butanediol diacrylate, 1,4-butanediol diacrylate, 1,6-hexanediol diacrylate, 1,9-nonanediol diacrylate, neopentyl glycol diacrylate, polytetramethylene glycol diacrylate, propoxylated neopentyl glycol diacrylate, dimethylol tricyclodecane diacrylate, bisphenol A ethylene oxide adduct diacrylate, and hydroxypivalic acid neopentyl glycol diacrylate. These difunctional acrylates may be used alone, or two or more difunctional acrylates may be used in combination.

Examples of monofunctional acrylates include methyl acrylate, ethyl acrylate, propyl acrylate, butyl acrylate, isobutyl acrylate, amyl acrylate, hexyl acrylate, 2-ethylhexyl acrylate, octyl acrylate, isooctyl acrylate, nonyl acrylate, dodecyl acrylate, hexadecyl acrylate, octadecyl acrylate, cyclohexyl acrylate, benzyl acrylate, methoxyethyl acrylate, butoxyethyl acrylate, phenoxyethyl acrylate, nonylphenoxyethyl acrylate, glycidyl acrylate, dimethylaminoethyl acrylate, diethylaminoethyl acrylate, bornyl acrylate, isobornyl acrylate, dicyclopentanyl acrylate, dicyclopentenyl acrylate, dicyclopentenyloxyethyl acrylate, tetrahydrofurfuryl acrylate and the like. These monofunctional acrylates may be used alone, or two or more monofunctional acrylates may be used in combination.

The amount of acrylates (B) to be mixed is preferably controlled within a range from 10 to 16% by mass, and more preferably from 11 to 14% by mass, based on the total mass of photocurable electroconductive ink composition of the present invention. The amount of less than 10% by mass may sometimes cause deterioration of curability. The amount of more than 16% by mass may sometimes cause poor workability (printability).

When acrylates (B) do not include monofunctional acrylates and are composed of a combination of tetrafunctional acrylates, trifunctional acrylates and difunctional acrylates, a combination of tetrafunctional acrylates, difunctional acrylates and monofunctional acrylates, or a combination of trifunctional acrylates, the total amount of tetrafunctional acrylates or trifunctional acrylates is preferably controlled within a range from 2 to 6% by mass, and more preferably from 3 to 5% by mass, based on the total mass of acrylates (B) in view of workability (printability, viscosity).

When acrylates (B) are composed of tetrafunctional acrylates, trifunctional acrylates, difunctional acrylates and monofunctional acrylates, the total amount of tetrafunctional acrylates and trifunctional acrylates is preferably controlled within a range from 2 to 6% by mass, and more preferably, from 3 to 5% by mass, based on the total mass of acrylates (B) in view of adhesion and flexibility.

The component (C) is an electroconductive filler. In the photocurable electroconductive ink composition of the present invention, 80% by mass or more of the electroconductive filler (C) is a scaly, foil-like or flakey silver powder having a particle size corresponding to a particle size distribution (PSD) at 50% of more than 5 μm. In the silver powder which accounts for 80% by mass or more of the total mass of the electroconductive filler (C), if a silver powder having a shape other than the above shape is used, it may become impossible to obtain sufficient curability, electroconductivity and fluidity. The particle size corresponding to a particle size distribution at 50% of 5 μm or less may sometimes cause not only aggregation of a silver powder easily and an increase in viscosity after the production of an electroconductive ink composition, but also insufficient photopolymerization reaction, leading to deterioration of adhesion after printing. The upper limit of the particle size corresponding to a particle size distribution at 50% of the electroconductive filler (C) is usually 12 μm, and particularly preferably 8 μm. The particle size corresponding to a particle size distribution at 50% can be measured, for example, by a well-known method such as a dynamic light scattering (DLS) method, a laser diffraction method, a precipitation method or the like.

It is possible to use, as the silver powder of the electroconductive filler (C), a pure silver powder, metal particles having a surface coated with silver, or a mixture thereof. The method for producing a silver powder is not also particularly limited, and may be any method such as a mechanical grinding method, a reduction method, an electrolytic method, or a gas phase method. Metal particles having a surface coated with silver are obtained by forming a silver coating layer on a surface of particles made of metal other than silver using a method such a plating method.

There is no particular limitation on the other electroconductive filler usable in combination with a scaly, foil-like or flakey silver powder, which accounts for 80% by mass or more in the electroconductive filler (C) and has a particle size corresponding to a particle size distribution at 50% of more than 5 μm, as long as it has electroconductivity, and the electroconductive filler is preferably metal or a carbon nano-tube. It is possible to use, as the metal, all powders of metals, which are handled as common conductors. Examples thereof include metal simple substances such as nickel, copper, silver, gold, aluminum, chromium, platinum, palladium, tungsten and molybdenum; alloys made of two or more types of these metals, products coated with these metals, or compounds of these metals, which have satisfactory electroconductivity. Among these, a spherical powder of pure silver or a spherical metal powder having a surface coated with silver is preferably used.

The amount of the electroconductive filler (C) to be mixed is controlled within a range from 77 to 85% by mass based on the total mass of photocurable electroconductive ink composition of the present invention. The amount of less than 77% by mass may make it impossible to obtain sufficient electroconductivity. On the other hand, the amount of more than 85% by mass may cause difficulty in maintaining low viscosity. In the photocurable electroconductive ink composition of the present invention, satisfactory electroconductivity was achieved by comparatively increasing the amount of the electroconductive filler (C) as compared with a conventional electroconductive paste and defining a particle size distribution as mentioned below.

The photopolymerization initiator as the component (D) absorbs ultraviolet rays irradiated to generate a radical, this initiating the photopolymerization reaction. The photopolymerization initiator is not particularly limited as long as it has a function capable of initiating the radical polymerization by optical excitation. Examples of usable photopolymerization initiator include molecule cleavage type photopolymerization initiators such as benzoin, benzoin ethyl ether, benzoin isopropyl ether, benzoin isobutyl ether, 2,4-diethylthioxanthone, 2-isopropylthioxanthone, benzyl, 2,4,6-trimethylbenzoyldiphenylphosphine oxide, 6-trimethylbenzoyldiphenylphosphine oxide, 2-benzyl-2-dimethylamino-1-(4-morpholinophenyl)-butan-1-one, bis(2,6-dimethoxybenzoyl)-2,4,4-trimethylpentylphosphine oxide, bis(2,4,6-trimethylbenzoyl)-phenylphosphine oxide, 2,4,4-trimethylpentylphosphine oxide, 1-hydroxycyclohexyl phenyl ketone, benzoin alkyl ether, benzyl dimethyl ketal, 2-hydroxy-2-methyl-1-phenylpropan-1-one, 1-(4-isopropylphenyl)-2-hydroxy-2-methylpropan-1-one and 2-methyl-1-(4-methylthiophenyl)-2-morpholinopropan-1-one; hydrogen abstraction type photopolymerization initiators such as benzyl, benzophenone, 4-phenylbenzophenone, isophthalphenone, 2-ethylanthraquinone, 2,4-diethylthioxanthone and 4-benzoyl-4'-methyl-diphenyl sulfide; and the like.

At least two photopolymerization initiators are used in the photocurable electroconductive ink composition of the present invention. Satisfactory printability, printing accuracy and high-speed printability can be obtained by using two or more photopolymerization initiators.

Among the above-mentioned photopolymerization initiators, a combination of the photopolymerization initiators is preferably a combination of at least two photopolymerization initiators selected from 1-hydroxycyclohexyl phenyl ketone, bis(2,4,6-trimethylbenzoyl)-phenylphosphine oxide, 2-methyl-1-(4-methylthiophenyl)-2-morpholinopropan-1-one, benzophenone and 2,4-diethylthioxanthone. It becomes possible to obtain particularly satisfactory printability, printing accuracy and high-speed printability by these combinations.

The amount of the photopolymerization initiator (D) to be mixed is not particularly limited, and is preferably controlled within a range from 0.5 to 3.0% by mass based on the total mass of photocurable electroconductive ink composition of the present invention. The amount of less than 0.5% by mass may sometimes cause uncuring of the ultraviolet curable ink. The amount of more than 3.0% by mass may cause remaining of the unreacted product of the photopolymerization initiator in a cured film. When the unreacted residues are exposed to sunlight or light of a fluorescent lamp, the unreacted residues may sometimes react with the cured film, thus causing deterioration of the cured film.

It is also possible to use in combination with a sensitizer so as to reduce oxygen inhibition in a photocuring reaction system to thereby accelerate the initiation reaction of the photopolymerization initiator (D). Examples of the sensitizer include trimethylamine, triethylamine, methyldimethanolamine, triethanolamine, p-diethylaminoacetophenone, ethyl p-dimethylaminobenzoate, isoamyl p-dimethylaminobenzoate, N,N-dimethylbenzylamine, 4,4'-bis(diethylamino)benzophenone and the like. Each amount of the photopolymerization initiator and the sensitizer is controlled within a range that does not impair the effects of the present invention.

In the photocurable electroconductive ink composition of the present invention, mixing of the polymeric dispersing agent (E) enables dispersion stabilization of the electroconductive filler (C), and also enables an improvement in adhesion of the electroconductive ink composition to a base material.

The polymeric dispersing agent (E) includes a main chain skeleton (resin compatible moiety) and an adsorption group as constituents. Examples of the main chain skeleton of the polymeric dispersing agent include, but are not particularly limited to, a polyether skeleton, a polyurethane skeleton, a polyacrylate skeleton, a polyester skeleton, a polyamide skeleton, polyimide skeleton, a polyurea skeleton and the like. In view of storage stability of the ink composition, a polyurethane skeleton, a polyacryl skeleton and a polyester skeleton are preferable. Examples of the structure of the polymeric dispersing agent include, but are not also particularly limited to, a linear structure, a random structure, a block structure, a comb type structure, a star type structure, a ball type structure and the like. In view of storage stability, a block structure or a comb type structure is preferable.

Examples of the adsorption group of the polymeric dispersing agent include, but are not also particularly limited to, a carboxyl group, a phosphoric acid group and an amino group. A polymeric dispersing agent having an acidic adsorption group such as a carboxyl group or a phosphoric acid group is particularly preferable.

Examples of the polymeric dispersing agent (E) include wet dispersing agents DISPER BYK series 101, 102, 103, 106, 108, 109, 110, 111, 112, 116, 130, 140, 142, 145, 161, 162, 163, 164, 166, 167, 168, 170, 171, 174, 180, 182, 183, 184, 185, 190, 191, 194, 2000, 2001, 2010, 2015, 2020, 2050, 2070, 2096 and 2150, which are commercially available from BYK Japan KK; EFKA series 4008, 4009, 4010, 4015, 4020, 4046, 4047, 4050, 4055, 4060, 4080, 4300, 4330, 4340, 4400, 4401, 4402, 4403, 4406, 4800, 5010, 5044, 5054, 5055, 5063, 5064, 5065, 5066, 5070 and 5244, which are commercially available from Ciba Specialty Chemicals Inc.; Solsperse series 3000, 11200, 13240, 13650, 13940, 16000, 17000, 18000, 20000, 21000, 24000SC, 24000GR, 26000, 28000, 31845, 32000, 32500, 32550, 32600, 33000, 34750, 35100, 35200, 36000, 36600, 37500, 38500, 39000, 53095, 54000, 55000, 56000 and 71000, which are commercially available from The Lubrizol Corporation; DISPARLON series 1210, 1220, 1831, 1850, 1860, 2100, 2150, 2200, 7004, KS-260, KS-273N, KS-860, KS-873N, PW-36, DN-900, DA-234, DA-325, DA-375, DA-550, DA-1200, DA-1401 and DA-7301, which are commercially available from Kusumoto Chemicals, Ltd.; AJISPER series PB-711, PB-821, PB-822, PN-411 and PA-111, which are commercially available from Ajinomoto Fine-Techno Co., Inc.; SURFYNOL series 104A, 104C, 104E, 104H, 104S, 104BC, 104DPM, 104PA, 104PG-50, 420, 440, DF110D, DF110L, DF37, DF58, DF75, DF210, CT111, CT121, CT131, CT136, GA, TG and TGE, which are commercially available from Air Products and Chemicals, Inc.; Floren series Floren D90, Floren G-700, Floren DOPA-33, Floren DOPA-15BHF, Floren DOPA-17HF and Floren NC-500, which are commercially available from KYOEISHA CHEMICAL Co., LTD.; Olfine series STG and E1004, which are commercially available from Nissin Chemical Industry Co., Ltd.; SN sparse series 70, 2120 and 2190, which are commercially available from SAN NOPCO LIMITED; ADEKA COL and ADEKA TOL series, which are commercially available from ADEKA CORPORATION; SUNNONIC series, NAROACTY CL series, EMULMIN series, NEWPOL PE series, IONET M series, IONET D series, IONET S series, IONET T series and SANSEPARER 100, which are commercially available from Sanyo Chemical Industries, Ltd.; ANTIFOAM-4B Conc., ANTIFOAM KH, NFR-1000, EDP-S6R, ED-03, Rosubigen D-10, GD-19R and KG-406R, which are commercially available from SENKA Corporation; and the like.

The amount of the polymeric dispersing agent (E) is not particularly limited, and is preferably controlled within a range from 0.01 to 0.5% by mass based on the total mass of photocurable electroconductive ink composition of the present invention.

If the amount is within the above range, an ink composition having excellent printability and storage stability is obtained.

It is also possible to appropriately mix, in addition to the above components (A) to (E), additives such as polymerization inhibitors, stabilizers, colorants, dyes, tackifiers, thixotropic agents, flame retardants and defoamers in the photocurable electroconductive ink composition of the present invention, if necessary, within a range that does not impair the effects of the present invention. The photocurable electroconductive ink composition of the present invention has a viscosity which enables printing without being controlled, and a medium may be appropriately mixed when the viscosity is controlled.

The photocurable electroconductive ink composition of the present invention can be obtained by mixing the above components (A), (B), (C), (D) and (E), and other components in any order. It is preferred that mixing is quickly performed. When using colorants, stirring is sufficiently performed so as not to impair uniformity. It is possible to employ, as the dispersing method, methods using a twin roll, a triple roll, a sand mill, a roll mill, a ball mill, a colloid mill, a jet mill, a beads mill, a kneader, a homogenizer and the like.

It is possible to use, as energy line for curing the photocurable electroconductive ink composition of the present invention, ultraviolet rays, visible rays, infrared rays, electron beams and the like. In order to realize high-speed printing, ultraviolet rays and electron beams are preferable.

It is possible to commonly use, as an UV irradiation system, a light source including light having a wavelength within a range from 200 to 500 nm, for example, UV irradiation systems including a high-pressure mercury lamp, an ultrahigh pressure mercury lamp, a metal halide lamp, a gallium lamp, a xenon lamp, a carbon arc lamp and the like.

When curing is performed by electron beams, an electron beam accelerator having energy of 100 to 500 eV can be commonly used.

The photocurable electroconductive ink composition of the present invention can be used in all printing and coating methods, such as flexographic printing, gravure printing, screen printing, inkjet printing, offset printing, bar coating, dip coating, flow coating, spray coating, spin coating, roller coating, reverse coating and air knife coating methods, and these methods can be appropriately selected according to a shape of a base material to be coated. Conventional flexographic printing has a problem that rubbing is likely to occur, while UV flexographic printing has a problem that ozone is generated and thus curing inhibition is likely to occur. Use of the photocurable electroconductive ink composition of the present invention enables complete solution of these problems. Accordingly, the photocurable electroconductive ink composition of the present invention is suited for flexographic printing.

There is no limitation on the material of the base material, to which the photocurable electroconductive ink composition of the present invention is applied, as long as the electroconductive ink composition can be printed. Examples thereof include polyvinyl chloride, polyvinyl alcohol, polyvinyl chloride, polyester, heat-shrinkable polyester, styrene-based resin, polyolefin, polyimide, polycarbonate, triacetyl cellulose, polyethersulfone and the like.

When printing is performed using the photocurable electroconductive ink composition of the present invention, the thickness of a print film is usually from 2 to 15 μm, and preferably from 3 to 12 μm, though it varies depending on a printing method. If the thickness is within a range from 2 to 15 μm, sufficient thickness can be obtained without causing deterioration of adhesion to the base material, and thus non-electrification is less likely to occur.

Applications of the photocurable electroconductive ink composition of the present invention include, for example, RFID(s), solar battery circuits, antennas, electromagnetic shields, basic circuits, touch panel electrodes, electronic circuits, precision conductor circuits, EL circuits, LED circuits, membrane wirings, GPS antennas, flexible circuits, display wirings, IC tags and the like. It is also possible to use the photocurable electroconductive ink composition of the present invention as various base materials, particularly packaging bodies for packaging non heat-treatable groceries, drinks, medicines, cosmetics, personal care items and photographic films, which have hitherto been incapable of employing a solver paste having excellent electroconductivity, thin films, electrode materials and the like.

EXAMPLES

The present invention will be more specifically described below by way of Examples, but the present invention is not limited to the following Examples.

Examples 1 to 6, Comparative Examples 1 to 5

(Production of Photocurable Electroconductive Ink Composition)

The respective materials shown in Table 1 were preliminarily kneaded and then kneaded by a triple roll to produce photocurable electroconductive ink compositions with each composition shown in Table 1 (numerical value of each material shows % by mass based on the total mass of the composition). The materials used are as follows.

[Conductive Filler]
Flakey silver powder (particle size corresponding to particle size distribution (PSD) at 50%: 6.8 μm, manufactured by Tanaka Kikinzoku Kogyo K.K.)
Flakey silver powder (particle size corresponding to particle size distribution (PSD) at 50%: 2.6 μm, manufactured by Tanaka Kikinzoku Kogyo K.K.)
Spherical silver powder (particle size corresponding to particle size distribution (PSD) at 50%: 1.3 μm, manufactured by Tanaka Kikinzoku Kogyo K.K.)

[Oligomer of Urethane Acrylates]
ALLONIX M-1960 (manufactured by Toagosei Co., Ltd., product name)

[Tetrafunctional Acrylates]
LIGHT ACRYLATE DGE-4A (ethylene oxide-modified diglycerin tetraacrylate, manufactured by KYOEISHA CHEMICAL Co., LTD., product name)

[Trifunctional Acrylates]
ALLONIX M-350 (trimethylolpropaneethylene oxide-modified Triacrylate, manufactured By Toagosei Co., Ltd., product name)

[Difunctional Acrylates]
LIGHT ACRYLATE 1.6HX-A (1,6-hexanediol diacrylate, manufactured by KYOEISHA CHEMICAL Co., LTD., product name)
LIGHT ACRYLATE 1.9ND-A (1,9-nonanediol diacrylate, manufactured by KYOEISHA CHEMICAL Co., LTD., product name)

[Monofunctional Acrylates]
LIGHT ACRYLATE PO-A (phenoxyethyl acrylate, manufactured by KYOEISHA CHEMICAL Co., LTD., product name)
LIGHT ESTER HOP-A(N) (2-hydroxypropyl acrylate, manufactured by KYOEISHA CHEMICAL Co., LTD., product name)

[Photopolymerization Initiator]
IRGACURE 500 (eutectic mixture of IRGACURE 184 (1-hydroxycyclohexyl phenyl ketone, product name) and benzophenone (sensitizer), manufactured by Ciba Specialty Chemicals Inc., product name)
IRGACURE 819 (bis(2,4,6-trimethylbenzoyl)-phenylphosphine oxide, manufactured by Ciba Specialty Chemicals Inc., product name)
IRGACURE 907 (2-methyl-1-(4-methylthiophenyl)-2-morpholinopropan-1-one, manufactured by Ciba Specialty Chemicals Inc., product name)
KAYACURE DETX-S (2,4-diethylthioxanthone, manufactured by Nippon Kayaku Co., Ltd., product name)

[Polymeric Dispersing Agent]
Disper BYK-111 (copolymer containing an acidic adsorption group, manufactured by BYK Japan KK, product name)

(Evaluation of Physical Properties and Functionality)
With respect to the above photocurable electroconductive ink compositions thus produced, physical properties and functionality were evaluated.

[Viscosity and TI Value]
Using a cone-type rotational viscometer (manufactured by HAAKE Manufacturing Company, Inc., Rheostress RS75, corn plate: made of titanium of 35 mm, measured at $\phi 1°$ and a gap of 0.050 mm), a viscosity was measured after maintaining at the measuring temperature of 25° C. and a shear rate of 0/s for 30 seconds, followed by maintaining at a shear rate of 10/s for 60 seconds. The results are shown in Table 2. A thixotropy index (TI) value was calculated from the above measured viscosity value and the value measured at a shear rate of 1/s in the same manner by the below-mentioned equation. The results are shown in Table 2.

TI value=(Viscosity of shear rate of 10/s)/(Viscosity of shear rate of 1/s)

If the viscosity value is 8 or less and also the TI value is 6 or less, it is easy to obtain satisfactory printability and printing accuracy in flexographic printing.

[Evaluation of Functionality]

Using a UV-curable flexographic printer (RK Print Coat Instruments Ltd. UK, trade name of FLEXIPROOF), an electroconductive circuit pattern having a width of 500 µm was flexographically printed on a polyvinyl chloride film or PET film by an anilox roll (500 lines/inch) and cured by irradiation with UV (300 mJ/cm$^2$) as photoactive radiation at a rate of 20 m/minute, and then a film thickness after curing, a resistance value, and printability were evaluated. The film thickness was measured by a thickness gauge Digital Micrometer (manufactured by Mitutoyo Corporation, trade name), and the volume resistivity was measured using a resistor M-Ohm HiTESTER 3540 (product name, manufactured by HIOKI E.E. CORPORATION). Regarding the printability, it was visually confirmed whether or not transfer errors and rubbing exist. Samples with transfer errors and rubbing were rated "Poor", whereas, samples with neither transfer errors nor rubbing were rated "Good". The results are shown in Table 2.

TABLE 1

| | | Example | | | | | | | Comparative Example | | | | | |
|---|---|---|---|---|---|---|---|---|---|---|---|---|---|---|
| | | 1 | 2 | 3 | 4 | 5 | 6 | 7 | 1 | 2 | 3 | 4 | 5 | 6 |
| Physical propetios | Viscosity (Pa · s) | 5.9 | 5.8 | 5.7 | 3.3 | 7.7 | 6.8 | 4.9 | 21.6 | 9.1 | 8.9 | 9 | 10 | 3.3 |
| | TI value | 4.2 | 3.9 | 4 | 2.4 | 2.2 | 3.8 | 2.1 | 3.9 | 2.1 | 4.2 | 3.5 | 3.4 | 2.4 |
| Functionality | Film thickness (µm) | 7 | 9 | 11 | 7 | 7 | 7 | 7 | 3 | 5 | 8 | 3 | 7 | 7 |
| | Printability | Good | Good | Good | Good | Good | Good | Good | Poor | Poor | Poor | Good | Good | Poor |
| | Specific resistance value (mΩ · cm) | 3.4 | 7.2 | 9.8 | 6.5 | 9.2 | 5.3 | 6.7 | — | — | — | 15.7 | 18.8 | — |

TABLE 2

| | Name of raw material | Type and characteristic value | Example | | | | | | | Comparative Example | | | | | |
|---|---|---|---|---|---|---|---|---|---|---|---|---|---|---|---|
| | | | 1 | 2 | 3 | 4 | 5 | 6 | 7 | 1 | 2 | 3 | 4 | 5 | 6 |
| Composition (% by mass) | Electro-conductive filler | Flaky silver powder, particle size corresponding to PSD at 50%: 6.8 µm | 83 | 83 | 83 | 80 | 85 | 67 | 83 | | 75 | 63 | 83 | 83 | 83 |
| | | Flaky silver powder, particle size corresponding to PSD at 50%: 2.6 µm | | | | | | | | 83 | | | | | |
| | | Spherical silver powder, particle size corresponding to PSD at 50%: 1.3 µm | | | | | | 10 | | | 25 | | | | |
| | Oligomer of urethane acrylates | ALLONIX M-1960 | 3.7 | 3.7 | 3.7 | 4.0 | 3.0 | 3.5 | 3.7 | 3.5 | 5.0 | 3.5 | 5.2 | 4.3 | 3.5 |
| | Tetra-functional acrylates | LIGHT ACRYLATE DGE-4A | | | | | | | 4.1 | | | | | | |
| | Trifunctional acrylates | ALLONIX M-350 | 4.1 | 4.1 | 4.1 | 5.3 | 3.3 | 4.3 | | 4.3 | 6.4 | 4.3 | | 7.8 | 4.3 |
| | Difunctional acrylates | LIGHT ACRYLATE 1 6HX-A | 3.7 | 3.7 | | 3.9 | 3.4 | 3.5 | 3.7 | 3.5 | 5.1 | 3.5 | 6.1 | | 3.5 |
| | Mono-functional acrylates | LIGHT ACRYLATE 1 9ND-A | | | | 3.7 | | | | | | | | | |
| | | LIGHT ACRYLATE PO A | 4.1 | 4.1 | | 4.6 | 4.0 | 4.3 | 4.1 | 4.3 | 5.7 | 4.3 | 4.3 | 3.5 | 4.3 |
| | | LIGHT ESTER HOP A(N) | | | | 4.1 | | | | | | | | | |
| | Photopoly-merization initiator | IRGACURE-500 | 0.5 | | | 0.6 | 0.3 | 0.4 | 0.4 | 0.4 | 0.8 | 0.4 | 0.4 | 0.4 | |
| | | IRGACURE-819 | 0.8 | | 0.8 | 1.5 | 0.7 | 0.9 | 0.9 | 0.9 | 1.7 | 0.9 | 0.9 | 0.9 | 1.3 |
| | | IRGACURE-907 | | 0.8 | 0.5 | | | | | | | | | | |
| | | IRGACURE DETX-S | | | 0.5 | | | | | | | | | | |
| | Polymeric discrsing agent | Dispor BYK-1 1 | 0.1 | 0.1 | 0.1 | 0.1 | 0.3 | 0.1 | 0.1 | 0.1 | 0.3 | 0.1 | 0.1 | 0.1 | 0.1 |

The above results revealed that the ultraviolet curable electroconductive ink composition of the present invention enables satisfactory printability and printing accuracy, and also exhibits stable electroconductive properties, even in the case of high-speed printing.

The invention claimed is:

1. A photocurable electroconductive ink composition comprising:
   (A) an oligomer of urethane acrylates,
   (B) three types of acrylates comprising (a) at least one monofunctional acrylate, (b) at least one difunctional acrylate, and (c) at least one trifunctional acrylate and/or at least one tetrafunctional acrylate,
   (C) an electroconductive filler,
   (D) two or more types of photopolymerization initiators selected from 1-hydroxycyclohexyl phenyl ketone, bis(2,4,6-trimethylbenzoyl)-phenylphosphine oxide, 2-methyl-1-(4-methylthiophenyl)-2-morpholinopropan-1-one, benzophenone and 2,4-diethylthioxanthone, and
   (E) a polymeric dispersing agent having a main chain skeleton which is a polyether skeleton, a polyurethane skeleton, a polyacrylate skeleton, a polyester skeleton, a polyamide skeleton, polyimide skeleton, or polyurea skeleton, wherein
   the amount of acrylates (B) is from 10 to 16% by mass, based on the total mass of photocurable electroconductive ink composition,
   the amount of the electroconductive filler (C) to be mixed is from 77 to 85% by mass based on the total mass of the photocurable electroconductive ink composition, and
   80% by mass or more of the electroconductive filler (C) is a scaly, foil-like or flakey silver powder having a particle size corresponding to a particle size distribution at 50% of more than 5 μm.

2. The photocurable electroconductive ink composition according to claim 1, wherein the amount of the oligomer (A) of urethane acrylates to be mixed is from 2 to 5% by mass, the amount of the photopolymerization initiator (D) to be mixed is from 0.5 to 3.0% by mass, and the amount of the polymeric dispersing agent (E) to be mixed is from 0.01 to 0.5% by mass, based on the total mass of the photocurable electroconductive ink composition.

3. The photocurable electroconductive ink composition according to claim 1, wherein the polymeric dispersing agent (E) is a polymeric dispersing agent having an acidic adsorption group.

4. A packaging body in which printing is performed on a base material using the photocurable electroconductive ink composition according to claim 1.

5. The photocurable electroconductive ink composition according to claim 1, wherein the amount of the oligomer (A) of urethane acrylates in said composition is from 2 to 5% by mass, based on the total mass of photocurable electroconductive ink composition.

6. The photocurable electroconductive ink composition according to claim 1, wherein the amount of the oligomer (A) of urethane acrylates in said composition is from 3 to 4% by mass, based on the total mass of photocurable electroconductive ink composition.

7. The photocurable electroconductive ink composition according to claim 1, wherein acrylates (B) comprises at least one monofunctional acrylate, at least one difunctional acrylate, and at least one trifunctional acrylate.

8. The photocurable electroconductive ink composition according to claim 1, wherein acrylates (B) comprises at least one monofunctional acrylate, at least one difunctional acrylate, and at least one tetrafunctional acrylate.

9. The photocurable electroconductive ink composition according to claim 1, wherein acrylates (B) comprises at least one monofunctional acrylate, at least one difunctional acrylate, at least one trifunctional acrylate, and at least one tetrafunctional acrylate.

10. The photocurable electroconductive ink composition according to claim 1, wherein said at least one tetrafunctional acrylate is selected from pentaerythritol tetraacrylate, ditrimethylolpropane tetraacrylate, ethoxylated pentaerythritol tetraacrylate, ethylene oxide-modified diglycerin tetraacrylate, and combinations thereof.

11. The photocurable electroconductive ink composition according to claim 1, wherein said at least one trifunctional acrylate is selected from trimethylolpropane triacrylate, glycerol triacrylate, ethylene oxide-modified trimethylolpropane triacrylate, pentaerythritol triacrylate, tris(2-hydroxyethyl)isocyanurate triacrylate, propoxylated glyceryl triacrylate, and combinations thereof.

12. The photocurable electroconductive ink composition according to claim 1, wherein said at least one difunctional acrylate is selected from ethylene glycol diacrylate, diethylene glycol diacrylate, triethylene glycol diacrylate, tetraethylene glycol diacrylate, polyethylene glycol (200) diacrylate, polyethylene glycol (400) diacrylate, polyethylene glycol (600) diacrylate, polyethylene glycol (1000) diacrylate, polypropylene glycol (400) diacrylate, polypropylene glycol (700) diacrylate, 1,3-butanediol diacrylate, 1,4-butanediol diacrylate, 1,6-hexanediol diacrylate, 1,9-nonanediol diacrylate, neopentyl glycol diacrylate, polytetramethylene glycol diacrylate, propoxylated neopentyl glycol diacrylate, dimethylol tricyclodecane diacrylate, bisphenol A ethylene oxide adduct diacrylate, hydroxypivalic acid neopentyl glycol diacrylate, and combinations thereof.

13. The photocurable electroconductive ink composition according to claim 1, wherein said at least one monofunctional acrylate is selected from methyl acrylate, ethyl acrylate, propyl acrylate, butyl acrylate, isobutyl acrylate, amyl acrylate, hexyl acrylate, 2-ethylhexyl acrylate, octyl acrylate, isooctyl acrylate, nonyl acrylate, dodecyl acrylate, hexadecyl acrylate, octadecyl acrylate, cyclohexyl acrylate, benzyl acrylate, methoxyethyl acrylate, butoxyethyl acrylate, phenoxyethyl acrylate, nonylphenoxyethyl acrylate, glycidyl acrylate, dimethylaminoethyl acrylate, diethylaminoethyl acrylate, bornyl acrylate, isobornyl acrylate, dicyclopentanyl acrylate, dicyclopentenyl acrylate, dicyclopentenyloxyethyl acrylate, tetrahydrofurfuryl acrylate, and combinations thereof.

14. The photocurable electroconductive ink composition according to claim 1, wherein the amount of acrylates (B) in said composition is from 11 to 14% by mass, based on the total mass of photocurable electroconductive ink composition.

15. The photocurable electroconductive ink composition according to claim 1, wherein upper limit of the particle size corresponding to a particle size distribution at 50% of the electroconductive filler (C) is 12 μm.

16. The photocurable electroconductive ink composition according to claim 1, wherein upper limit of the particle size corresponding to a particle size distribution at 50% of the electroconductive filler (C) is 8 μm.

17. The photocurable electroconductive ink composition according to claim 1, wherein the amount of photopolymerization initiators (D) in said composition is from 0.5 to 3.0% by mass, based on the total mass of photocurable electroconductive ink composition.

18. The photocurable electroconductive ink composition according to claim 1, wherein acrylates (B) comprise phenoxyethyl acrylate, 1,6-hexanediol diacrylate, and ethylolpropane ethylene oxide-modified triacrylate.

19. The photocurable electroconductive ink composition according to claim 1, wherein said composition has a viscosity of less than 8 Pa·s.

20. The photocurable electroconductive ink composition according to claim 1, wherein said polymeric dispersing agent contains adsorption groups selected from carboxyl groups, phosphoric acid groups, and amino groups.

21. The photocurable electroconductive ink composition according to claim 7, wherein total amount of trifunctional acrylates is from 2 to 6% by mass, based on the total mass of acrylates (B).

22. The photocurable electroconductive ink composition according to claim 8, wherein the total amount of tetrafunctional acrylates and trifunctional acrylates is from 2 to 6% by mass, based on the total mass of acrylates (B).

* * * * *